US008282769B2

(12) United States Patent
Iizuka (10) Patent No.: US 8,282,769 B2
(45) Date of Patent: Oct. 9, 2012

(54) SHOWER HEAD AND PLASMA PROCESSING APPARATUS HAVING SAME

(75) Inventor: Hachishiro Iizuka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 261 days.

(21) Appl. No.: 12/719,175

(22) Filed: Mar. 8, 2010

(65) Prior Publication Data

US 2010/0230051 A1    Sep. 16, 2010

Related U.S. Application Data

(60) Provisional application No. 61/176,554, filed on May 8, 2009.

(30) Foreign Application Priority Data

Mar. 10, 2009   (JP) ................................ 2009-056523

(51) Int. Cl.
   *C23C 16/00*   (2006.01)
   *C23F 1/00*   (2006.01)
   *H01L 21/306*   (2006.01)

(52) U.S. Cl. ......... 156/345.34; 156/345.33; 156/345.37; 118/715

(58) Field of Classification Search ............. 156/345.33, 156/345.34, 345.37; 118/715
   See application file for complete search history.

(56) References Cited

U.S. PATENT DOCUMENTS

| | | | | |
|---|---|---|---|---|
| 4,209,357 A | * | 6/1980 | Gorin et al. | 438/710 |
| 6,818,096 B2 | * | 11/2004 | Barnes et al. | 156/345.43 |
| 7,713,377 B2 | * | 5/2010 | Cooke et al. | 156/345.33 |
| 2005/0056217 A1 | * | 3/2005 | Yamada et al. | 118/715 |
| 2006/0137820 A1 | * | 6/2006 | Lee et al. | 156/345.37 |
| 2007/0022954 A1 | * | 2/2007 | Iizuka et al. | 118/724 |

FOREIGN PATENT DOCUMENTS

| | | |
|---|---|---|
| CN | 1830072 A | 9/2006 |
| JP | 2003-68710 | 3/2003 |
| JP | 2006-352040 | 12/2006 |

OTHER PUBLICATIONS

Chinese Office Action issued Aug. 10, 2011, in Patent Application No. 201010132396.7 (with English-language translation).

* cited by examiner

*Primary Examiner* — Rakesh Dhingra
(74) *Attorney, Agent, or Firm* — Oblon, Spivak, McClelland, Maier & Neustadt, L.L.P.

(57) ABSTRACT

A shower head is provided, in a processing chamber in which a substrate is processed, to face a mounting table for mounting the substrate thereon. The shower head includes: a facing surface that faces the mounting table to supply a gas to the substrate in a form of shower through a plurality of gas injection holes formed on the facing surface; an opposing surface provided opposite to the facing surface; and a plurality of bar-shaped heat transfer columns standing on the opposing surface. Here, the heat transfer columns have varying lengths and/or thicknesses to adjust heat capacities thereof. The heat transfer columns are made of one of aluminum, stainless steel, and copper.

13 Claims, 7 Drawing Sheets

SHOWER HEAD AND PLASMA PROCESSING APPARATUS HAVING SAME

CROSS-REFERENCE TO RELATED APPLICATIONS

This application claims priority to Japanese Patent Application No. 2009-056523 filed on Mar. 10, 2009, the entire contents of which are incorporated herein by reference.

FIELD OF THE INVENTION

The present invention relates to a shower head provided in a processing chamber in which a substrate is processed and supplying a gas toward the substrate in a form of shower, and a plasma processing apparatus having same.

BACKGROUND OF THE INVENTION

Typically, in the manufacture of semiconductor devices or the like, a shower head has been used to supply a gas toward a substrate such as a semiconductor wafer or the like in a form of shower. For example, in a plasma processing apparatus for performing a plasma etching process on a substrate such as a semiconductor wafer or the like, a mounting table for mounting the substrate thereon is provided inside a processing chamber and a shower head is provided to face the mounting table. In the shower head, a plurality of gas injection holes is formed on a facing surface that faces the mounting table and a gas is injected toward the substrate through the gas injection holes in a form of shower.

In the plasma processing apparatus, since a plasma is generated in the processing chamber, the temperature of the shower head is increased. For this reason, there has been disclosed a plasma processing apparatus in which a fan or the like is provided to air-cool the shower head (see, e.g., Japanese Patent Application Publication No. 2003-068710). Moreover, there has been disclosed a plasma processing apparatus in which the shower head is cooled by allowing a temperature control medium to be circulated therearound (see, e.g., Japanese Patent Application Publication No. 2006-352040).

The above-described plasma processing apparatus cooling the shower head by the air cooling or the circulation of the temperature control medium is configured to exhaust the processing chamber from a lower portion thereof. In the meantime, the present inventors have been developing a shower head serving as not only a gas supply unit through which a gas can be supplied but also a gas exhaust unit having a plurality of gas exhaust holes through which gas exhaust is performed, to thereby improve the uniformity of gas flow.

However, if a mechanism for performing the cooling by circulating a coolant is applied to the shower head serving as both the gas supply unit and the gas exhaust unit, it would cause paths of the gas exhaust holes to extend, thereby deteriorating the exhaust performance.

Further, since such a shower head requires a cylindrical member (exhaust line) constituting an exhaust path above the shower head, it is difficult to provide an air-cooling unit for directly cooling the shower head. For that reason, the temperature of the shower head would be increased and the temperature distribution of the shower head may also become nonuniform, thereby deteriorating the uniformity of processing.

SUMMARY OF THE INVENTION

In view of the above, the present invention provides a shower head capable of suppressing the increase in temperature thereof and making uniform the temperature distribution thereof to improve the uniformity of processing, and a plasma processing apparatus having same.

In accordance with an aspect of the present invention, there is provided a shower head provided, in a processing chamber in which a substrate is processed, to face a mounting table for mounting the substrate thereon. The shower head includes: a facing surface that faces the mounting table to supply a gas to the substrate in a form of shower through a plurality of gas injection holes formed on the facing surface; an opposing surface provided opposite to the facing surface; and a plurality of bar-shaped heat transfer columns standing on the opposing surface.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Embodiments of the present invention will now be described with reference to the accompanying drawings which form a part hereof.

Figure 1:
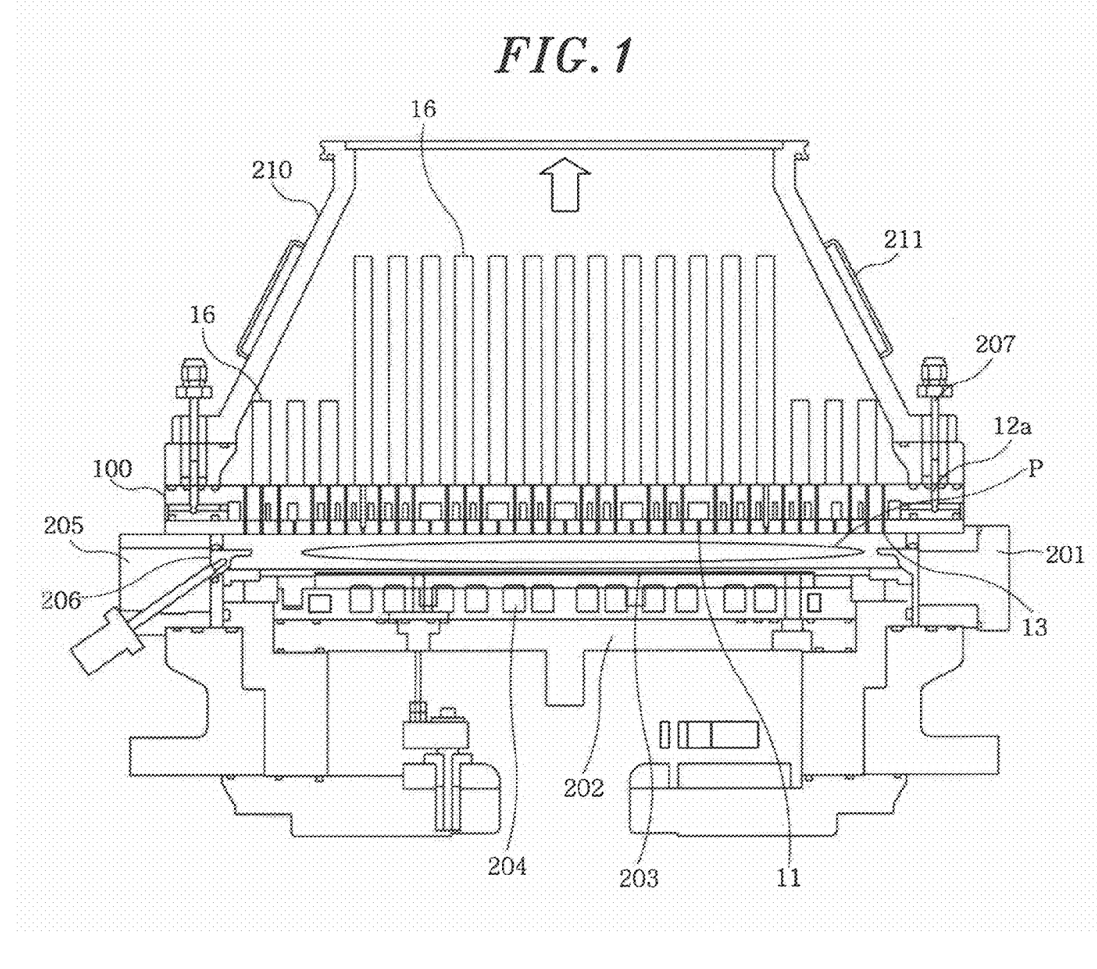
FIG. 1 is a cross sectional view showing a structure of a plasma processing apparatus in accordance with an embodiment of the present invention.
Figure 2:
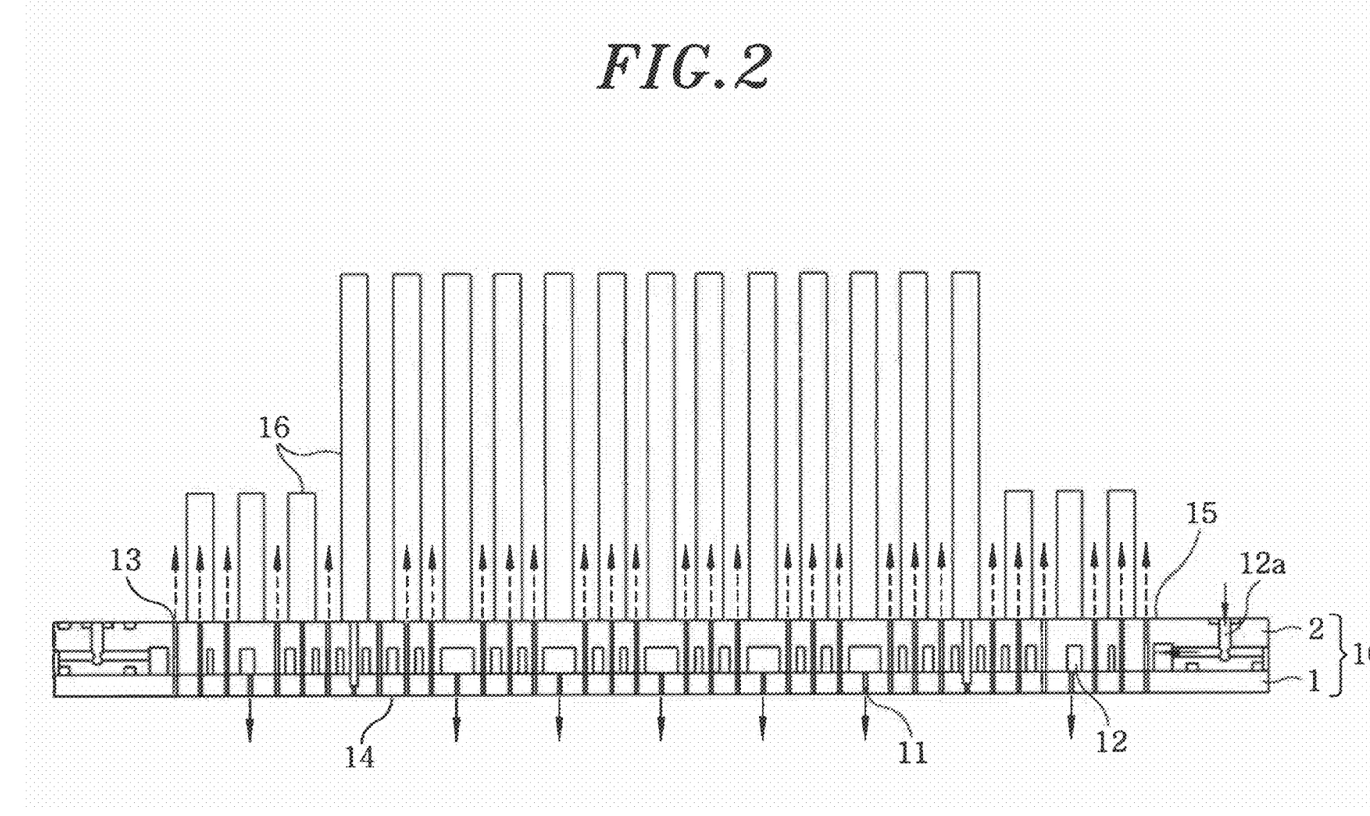
FIG. 2 is a cross sectional view showing a structure of a shower head in accordance with the embodiment of the present invention.

As shown in FIG. 2, the shower head 100 includes a laminated body 10 in which a plate shaped bottom member 1 and a plate shaped top member 2 are laminated, the top member 2 being arranged above the bottom member 1. The plate shaped members 1 and 2 are made of, e.g., an aluminum or the like, the surface of which is anodically oxidized. As shown in FIG. 1, in a processing chamber 201 of the plasma etching apparatus 200, the shower head 100 is arranged to face the mounting table 202 on which a semiconductor wafer (substrate) is mounted. In other words, the bottom member 1 shown in FIG. 2 provides a facing surface 14 that faces the mounting table 202 shown in FIG. 1.

A plurality of gas injection holes 11 is formed in the bottom member 1 of the laminated body 10 providing the facing surface 14 that faces the mounting table 202. Moreover, gas channels 12 communicating with the gas injection holes 11 are formed between the bottom and the top member 1 and 2. Such gas injection holes 11 are formed to supply a gas toward the substrate (lower side in FIG. 2) in a form of shower as illustrated by arrows in FIG. 2. Provided at a peripheral portion of the laminated body 10 is a gas inlet portion 12a from which the gas is introduced into the gas channels 12.

A plurality of gas exhaust holes 13 is formed in the laminated body 10, i.e., the bottom and top member 1 and 2, to extend therethrough. The gas exhaust holes 13 constitutes a gas exhaust unit that performs the gas exhaust, allowing a gas flows from the substrate side (lower side in FIG. 2) to a side (upper side in FIG. 2) opposite to the substrate 12 as illustrated by dotted-line arrows in FIG. 2.

Figure 3:
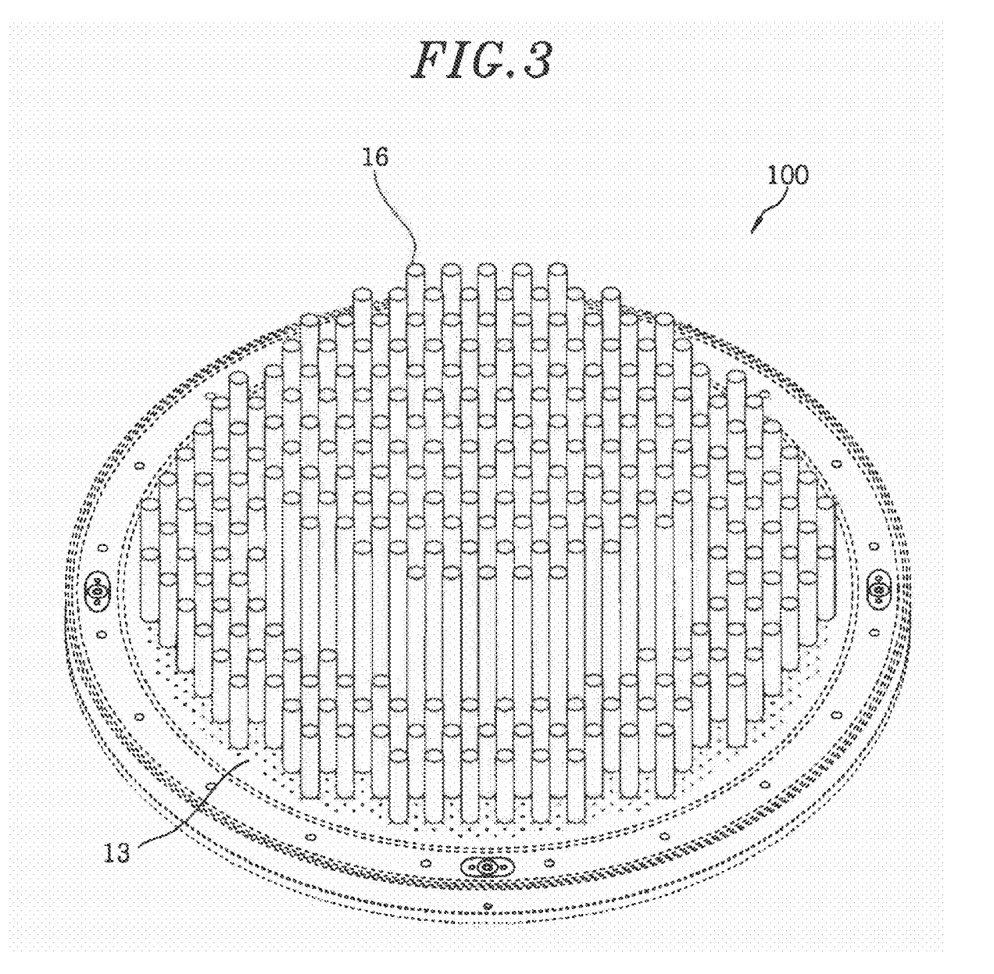
FIG. 3 is a perspective view showing the shower head in accordance with the embodiment of the present invention.
Figure 4:
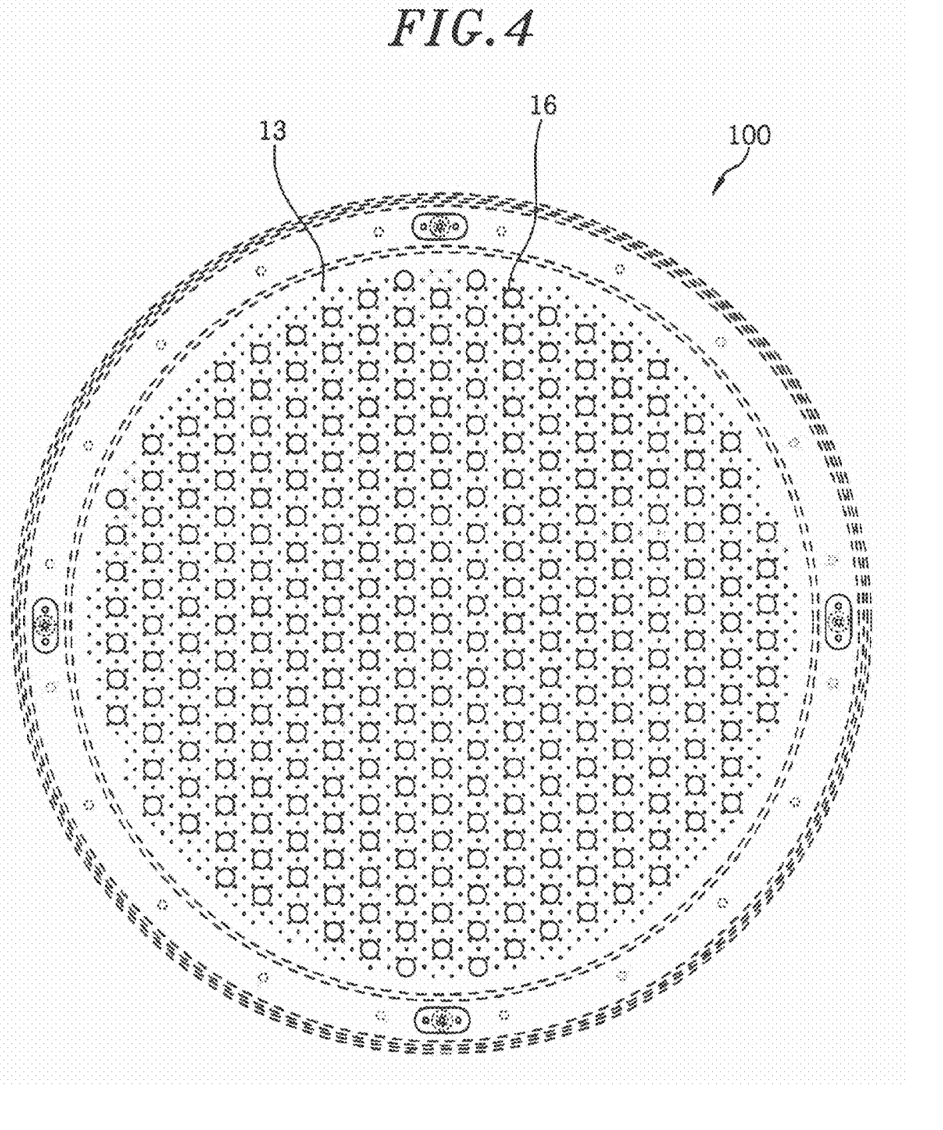
FIG. 4 is a top plan view showing the shower head in accordance with the embodiment of the present invention.
Figure 5:
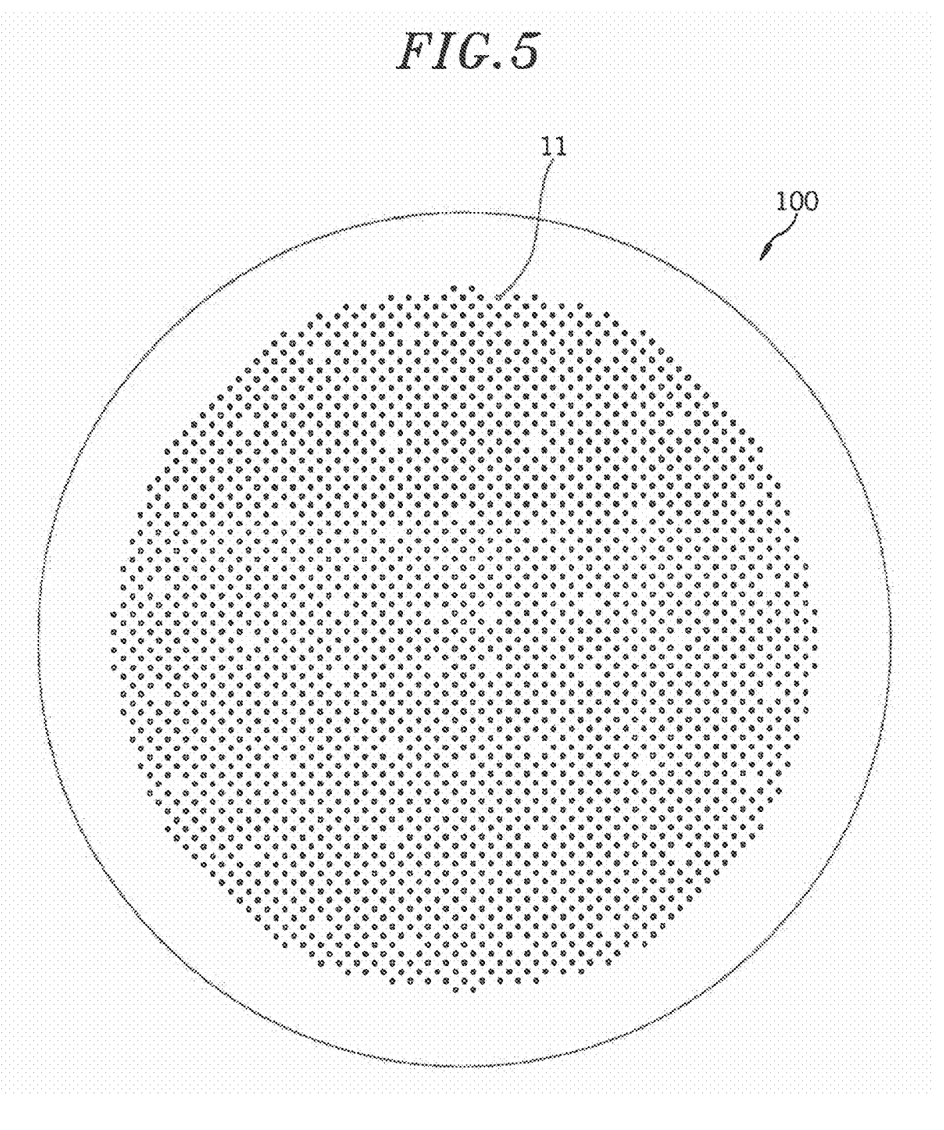
FIG. 5 is a bottom plan view showing the shower head in accordance with the embodiment of the present invention.

The gas exhaust holes 13 have a diameter of, e.g., about 3 mm. The gas exhaust holes 13 are substantially uniformly formed over an entire area of the shower head 100, excluding a peripheral portion thereof shown in FIG. 3, which is a joint portion with the processing chamber 201. As for the number of the gas exhaust holes 13, the shower head 100 for processing a semiconductor wafer of, e.g., about 10 inches, has about 700 to 1000 gas exhaust holes 13. In this embodiment, as shown in FIG. 3, the outer appearance of the shower head 100 has a circular plate shape conformal to that of the semiconductor wafer as a target substrate.

Moreover, a plurality of bar-shaped heat transfer columns 16 is stood on a surface 15 at the top member 2 side, i.e., the side opposite to the facing surface 14 that faces the mounting table 202. The heat transfer columns 16, as shown in FIG. 3, are substantially uniformly arranged over the entire area of the shower head 100 excluding a peripheral portion thereof, which is the joint portion with the processing chamber 201.

The heat transfer columns 16 are also made of a material having high thermal conductivity, e.g., copper, stainless steel, or aluminum. Alternatively, the heat transfer columns 16 may be made of an alloy of aluminum or copper in which another element is slightly added to obtain a better mechanical property and/or a better thermal conductivity.

When the heat transfer columns 16 are made of copper, it is preferable to perform the surface treatment. The purpose of the surface treatment is to prevent the unfavorable influence on the semiconductor wafer due to the dispersion of copper from the surfaces of the heat transfer columns 16. As for the number of the heat transfer columns 16, the shower head 100 for processing a semiconductor wafer of, e.g., about 10 inches has about several tens to a hundred and several tens of heat transfer columns 16.

The heat transfer columns 16 are provided to prevent the excessive increase in temperature of the shower head 100 by transferring a heat through the heat transfer columns 16, when the facing surface 14 side of the shower head 100 is exposed to a plasma and heated thereby. Furthermore, the heat transfer columns 16 serve to prevent the variation of temperature distribution between a central portion and a peripheral portion of the shower head 100.

In other words, as shown in FIG. 1, the peripheral portion of the shower head 100 is supported by and joined to the processing chamber 201 of the plasma etching apparatus 200. Accordingly, it is easy for a heat to be transferred to the processing chamber 201 at the peripheral portion, while the heat is likely to be trapped at the central portion thereof if no heat transfer column 16 is provided. For that reason, the temperature distribution variation may occur between the central portion and the peripheral portion of the shower head 100 such that the temperature of the former becomes higher, and that of the latter becomes lower in comparison.

If there occurs the variation of temperature distribution in the shower head 100 as described above, the state of a plasma P shown in FIG. 1 becomes nonuniform, causing the state of plasma etching to be nonuniform as well. The heat transfer columns 16 are used to make uniform the state of the plasma P, causing the state of plasma etching to be uniform. For that reason, the heights of the heat transfer columns 16 arranged close to the peripheral portion of the shower head 100 are set to be lower (heat capacity being smaller) than those of the heat transfer columns 16 arranged at the central portion thereof. Alternatively, the thicknesses and/or the heights of the heat transfer columns 16 may be changed to adjust the heat capacity.

Next, the structure of the plasma etching apparatus 200, as an example of the plasma processing apparatus including the shower head 100, will be described with reference to FIG. 1. The plasma etching apparatus 200 is of a capacitively coupled parallel plate type where electrode plates are arranged at an upper and a lower portion, respectively, and a power supply for plasma formation is connected.

The plasma etching apparatus 200 includes the cylindrical processing chamber 201 made of, e.g., aluminum whose surface is anodically oxidized. The processing chamber 201 is grounded. In the processing chamber 201, there is provided the mounting table 202 for mounting a target substrate, such as a semiconductor wafer, thereon and serving as a lower electrode. Furthermore, a high frequency supply unit (not shown), such as a high frequency power supply, is connected to the mounting table 202.

Provided at an upper side of the mounting table 202 is an electrostatic chuck 203 for holding and attracting the semiconductor wafer thereon. The electrostatic chuck 203 includes insulting members and an electrode provided therebetween. By applying a DC voltage to the electrode, a Coulomb force is generated; hence, the semiconductor wafer is held by and attracted to the electrostatic chuck 203.

Moreover, flow paths 204, through which a temperature control medium is circulated, are formed in the mounting table 202 to adjust to a preset level the temperature of the semiconductor wafer attracted on the electrostatic chuck 203. In the meantime, an opening 205 is formed at a sidewall portion of the processing chamber 201, trough which the semiconductor wafer is loaded to and unloaded from the processing chamber 201. Further, an on-off unit 206 for airtightly blocking the opening 205 is provided thereat.

The shower head 100 shown in FIG. 2 is arranged above the mounting table 202 to be opposite to each other at a predetermined interval. As a result, a pair of opposite electrodes is formed by providing the shower head 100 as an upper electrode and the mounting table 202 as a lower electrode.

The gas inlet portion 12a of the shower head 100 is connected to a gas supply unit 207 provided in the processing chamber 201. A predetermined processing gas (etching gas) is supplied from a gas supply mechanism (not shown) to the gas supply unit 207.

Moreover, provided at an upper side of the shower head 100 is a cylindrical member 210 having, e.g., a taper shape that a diameter thereof progressively gets smaller in an upper direction. A vacuum pump (not shown) such as a turbo molecular pump or the like is connected to the cylindrical member 210 via an on-off control valve, an on-off unit and the like.

As such, an inner side of the cylindrical member 210 serves as an exhaust path and the heat transfer columns 16 are arranged within the exhaust path inside the cylindrical member 210. Further, a temperature control unit 211 for controlling the temperature of the cylindrical member 210 by circulating a temperature control medium is provided at an outer side of the cylindrical member 210.

To perform the plasma etching on the semiconductor wafer by the plasma etching apparatus 200, the semiconductor wafer is firstly loaded into the processing chamber 201 through the opening 205 to be mounted on the electrostatic chuck 203. Then, the semiconductor wafer is held by and attracted to the electrostatic chuck 203. Successively, the opening 205 is closed and the processing chamber 201 is evacuated to a preset vacuum level by the vacuum pump or the like.

Thereafter, a processing gas (etching gas) is supplied at a preset flow rate from the gas supply unit 207 to the gas inlet portion 12a of the shower head 100. Then, the processing gas is injected through the gas channel 12 from the gas injection holes 11 in a form of shower to the semiconductor wafer mounted on the mounting table 202.

The pressure inside the processing chamber 201 is maintained to a preset level and, then, a high frequency power of a preset frequency, e.g., 13.56 MHz, is supplied to the mounting table 202. Accordingly, a high frequency electric field is generated between the shower head 100 serving as the upper electrode and the mounting table 202 serving as the lower electrode. Thus, the etching gas is converted to a plasma by dissociation. The etching process is performed on the semiconductor wafer by the plasma.

In the etching process, the processing gas supplied in a form of shower through the gas injection holes 11 is dispersed to the shower head 100. Then, the processing gas is exhausted through the gas exhaust holes 13. Accordingly, no gas flows from a central portion to a peripheral portion of the semiconductor wafer, unlike the case that the gas is exhausted from a lower portion of the processing chamber 201.

Thus, it is possible to make uniform the processing gas supplied to the semiconductor wafer. Moreover, although the temperature of the shower head 100 is increased due to the heat of the plasma, it is possible to suppress the variation of temperature distribution between the central portion and the peripheral portion of the shower head 100 by using the heat transfer columns 16. Accordingly, the state of the plasma P can be made uniform, thereby uniformly performing the etching treatment over the entire area of the semiconductor wafer. That is, it is possible to improve the in-plane uniformity of processing.

Then, once the plasma etching treatment is completed, the supply of the high frequency power and the processing gas is stopped and the semiconductor wafer is unloaded from the processing chamber 201 in the reverse order.

As described above, since gas exhaust is upwardly performed through the shower head 100 in the plasma etching apparatus of the present embodiment, it is possible to more uniformly supply the processing gas to the semiconductor wafer. Furthermore, it is possible to suppress the variation of temperature distribution between the central portion and the peripheral portion of the shower head 100. Therefore, the etching treatment can be performed over the entire area of the semiconductor wafer. In addition, it is not required to provide a circulation mechanism for a temperature control medium on the shower head 100 and, thus, the paths of the gas exhaust holes 13 are not elongated. As a result, the exhaust performance is not deteriorated.

Moreover, since the processing gas is exhausted through the gas exhaust holes 13 provided in the plasma etching apparatus 200, it is not necessary to provide an exhaust path around the mounting table 202 or the shower head 100 unlike the conventional method. Accordingly, it is possible to allow the diameter of the processing chamber to more closely approach to an outer diameter of the semiconductor wafer as the target substrate. As a result, it is possible to scale down the plasma etching apparatus 200. Furthermore, the vacuum pump is provided above the processing chamber 201, so that the gas can be efficiently exhausted through an area closer to a processing space of the processing chamber 201. Accordingly, it is possible to reduce the capacity of the vacuum pump to scale down same.

Figure 6:
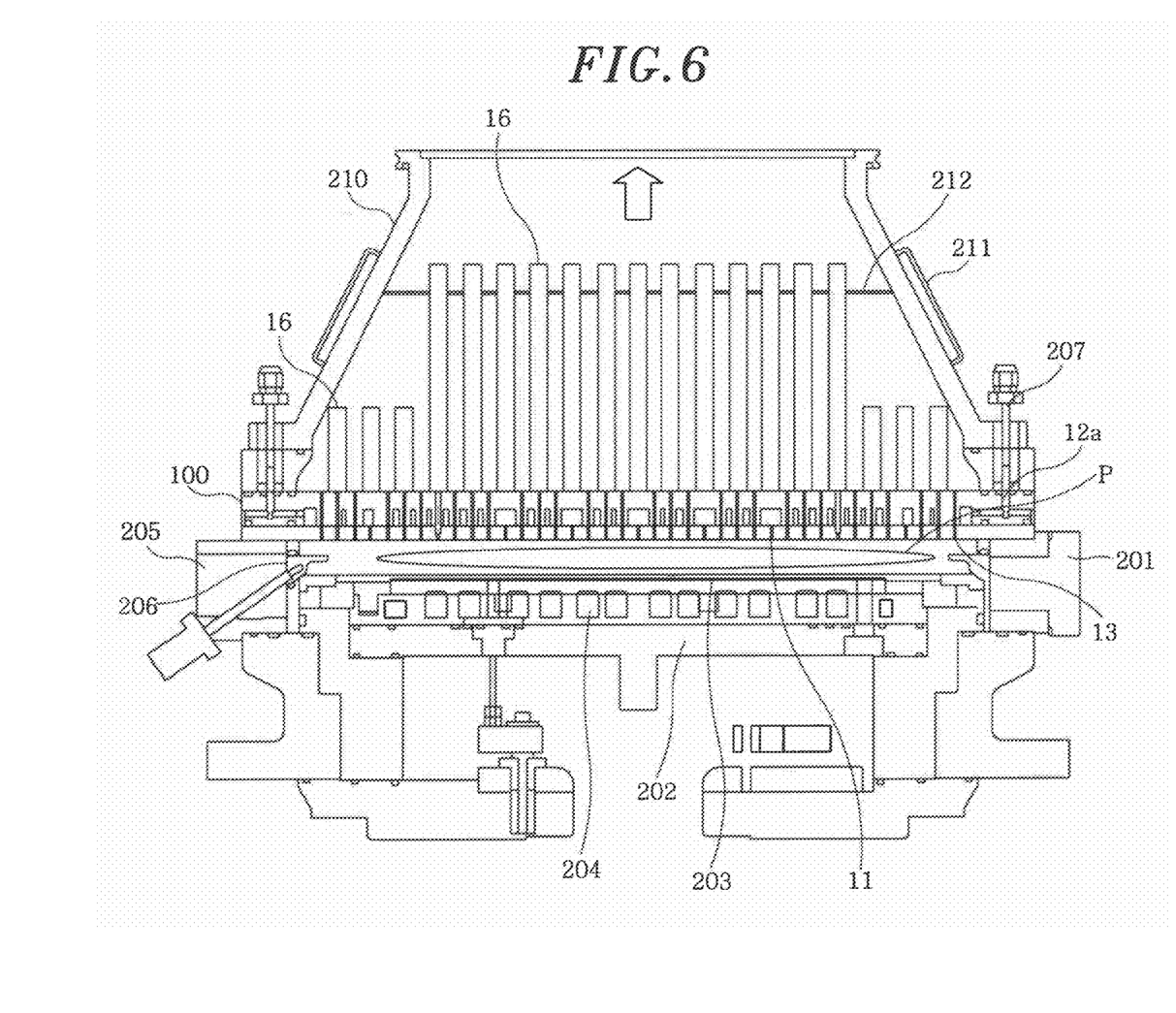
FIG. 6 is a cross sectional view showing a structure of a plasma processing apparatus in accordance with another embodiment of the present invention.

However, in the aforementioned embodiment, the heat beyond the heat capacity of the heat transfer columns 16 may be transferred from the plasma P to the shower head 100, thereby causing the variation of temperature distribution to occur in the shower head 100. In such a case, as shown in FIG. 6, it is possible to provide a heat transfer member 212, which connects the heat transfer columns 16 to the cylindrical member 210, to transfer the heat from the former to the latter therethrough, wherein the temperature of cylindrical member 210 is controlled by the temperature control unit 211.

Figure 7:
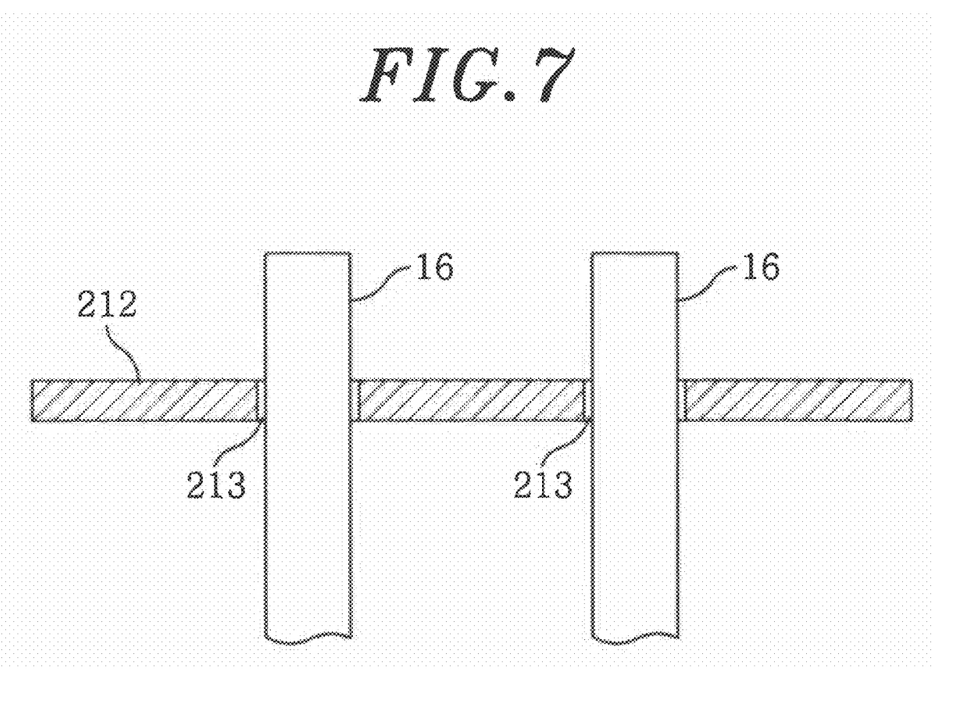
FIG. 7 is an enlarged view showing a configuration of main elements of the plasma processing apparatus shown in FIG. 6.

In addition, as shown in FIG. 7, there may be provided a through hole 213 having, at room temperature, a diameter that is slightly greater than that of the heat transfer column 16 for each of the heat transfer columns 16, so that the heat transfer member 212 is brought into non-contact with the heat transfer columns 16 at a normal temperature. However, when there is the thermal expansion due to the increase in the temperature of the heat transfer columns 16, the heat transfer member 212 is brought into contact with the heat transfer columns 16 to receive the heat therefrom.

In such a case, if the heat transfer member 212 is brought into contact with the heat transfer columns 16 to dissipate the heat therefrom and, thus, the temperature of the heat transfer columns 16 is decreased, the heat transfer member 212 is again brought into non-contact with the heat transfer columns 16. As a result, only when the temperature of the heat transfer columns 16 is increased, the heat can be automatically dissipated through the heat transfer member 212. In such a configuration, it is preferable that the heat transfer column 16 is made of a metal material having a greater linear thermal expansion coefficient than that of the heat transfer member 212.

In accordance with the embodiments of the present invention, it is possible to provide a shower head capable of suppressing the increase in temperature and making uniform the temperature distribution to improve the uniformity of processing, and a plasma processing apparatus having same.

While the invention has been shown and described with respect to the embodiments, it will be understood by those skilled in the art that various changes and modification may be made without departing from the scope of the invention as defined in the following claims.

What is claimed is:

1. A shower head provided, in a processing chamber in which a substrate is processed, to face a mounting table for mounting the substrate thereon, the shower head comprising:
   a facing surface that faces the mounting table to supply a gas to the substrate in a form of shower through a plurality of gas injection holes formed on the facing surface;
   an opposing surface provided opposite to the facing surface; and
   a plurality of bar-shaped heat transfer columns standing on the opposing surface,
   wherein a heat transfer member is provided within a cylindrical member provided at an upper side of the shower head to run across the cylindrical member and the heat transfer member has through holes,
   wherein part of the heat transfer columns is disposed to pass through the through holes and a diameter of each of said part of the heat transfer columns is smaller than that of each of the through holes; and
   the showerhead further comprising a plurality of gas exhaust holes provided extending between the facing surface and the opposing surface to exhaust a gas from the facing surface toward the opposing surface,
   wherein the heat transfer columns are provided within an exhaust path.

2. The shower head of claim 1, wherein the heat transfer columns have varying lengths and/or thicknesses to adjust heat capacities thereof.

3. The shower head of claim 1, wherein the heat transfer columns are made of one of aluminum, stainless steel, and copper.

4. The shower head of claim 1, wherein a height of heat transfer columns arranged at a peripheral portion of the shower head is lower than that of heat transfer columns arranged at a central portion thereof, and wherein said part of the heat transfer columns disposed to pass through the through holes is located at the central portion of the shower, and said part of heat transfer columns is not brought into contact with the heat transfer member at room temperature, and said part of heat transfer columns is brought into contact with the heat transfer member when thermal expansion occurs so that said part of heat transfer columns is connected, via the heat transfer member, to a sidewall portion of the cylindrical member constituting the exhaust path.

5. The shower head of claim 1, wherein a temperature control unit is provided at the sidewall portion of the cylindrical member.

6. The shower head of claim 1, wherein a linear thermal expansion coefficient of the heat transfer columns is greater than that of the heat transfer member.

7. A plasma processing apparatus, comprising:

a shower head provided, in a processing chamber in which a substrate is processed, to face a mounting table for mounting the substrate thereon, the shower head comprising: a facing surface that faces the mounting table to supply a gas to the substrate in a form of shower through a plurality of gas injection holes formed on the facing surface; an opposing surface provided opposite to the facing surface; and a plurality of bar-shaped heat transfer columns standing on the opposing surface;

a cylindrical member provided at an upper side of the shower head; and a heat transfer member provided within the cylindrical member to run across the cylindrical member, the heat transfer member having through holes, wherein part of the heat transfer columns is disposed to pass through the through holes and a diameter of each of said part of the heat transfer columns is smaller than that of each of the through holes, wherein the shower head further comprises a plurality of gas exhaust holes provided extending between the facing surface and the opposing surface to exhaust a gas from the facing surface toward the opposing surface, and the heat transfer columns are provided within an exhaust path.

8. The apparatus of claim 7, wherein the shower head serves as a facing electrode that faces the mounting table.

9. The apparatus of claim 7, wherein the heat transfer columns have varying lengths and/or thicknesses to adjust heat capacities thereof.

10. The apparatus of claim 7, wherein the heat transfer columns are made of one of aluminum, stainless steel, and copper.

11. The apparatus of claim 7 wherein a height of heat transfer columns arranged at a peripheral portion of the shower head is lower than that of heat transfer columns arranged at a central portion thereof, and wherein said part of the heat transfer columns disposed to pass through the through holes is located at the central portion of the shower, wherein said part of heat transfer columns is not brought into contact with the heat transfer member at room temperature, and said part of heat transfer columns is brought into contact with the heat transfer member when thermal expansion occurs so that said part of heat transfer columns is connected, via the heat transfer member, to a sidewall portion of the cylindrical member constituting the exhaust path.

12. The shower head of claim 11, wherein a temperature control unit is provided at the sidewall portion of the cylindrical member.

13. The apparatus of claim 7, wherein a linear thermal expansion coefficient of the heat transfer columns is greater than that of the heat transfer member.

* * * * *